(12) United States Patent
Kubo et al.

(10) Patent No.: US 11,415,764 B2
(45) Date of Patent: Aug. 16, 2022

(54) OPTICAL MODULE

(71) Applicant: Fujitsu Optical Components Limited, Kawasaki (JP)

(72) Inventors: Teruhiro Kubo, Kitahiroshima (JP); Yuka Ojima, kawasaki (JP); Tetsuo Ishizaka, Inagi (JP); Tomoyuki Ito, Sapporo (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 17/132,918

(22) Filed: Dec. 23, 2020

(65) Prior Publication Data
US 2021/0278614 A1  Sep. 9, 2021

(30) Foreign Application Priority Data

Mar. 4, 2020  (JP) .............................. JP2020-036724

(51) Int. Cl.
*H04B 10/00*  (2013.01)
*G02B 6/42*  (2006.01)
*H05K 1/02*  (2006.01)
*H05K 7/20*  (2006.01)

(52) U.S. Cl.
CPC .......... *G02B 6/4266* (2013.01); *G02B 6/428* (2013.01); *G02B 6/4257* (2013.01); *G02B 6/4284* (2013.01); *H05K 1/0203* (2013.01); *H05K 7/2039* (2013.01)

(58) Field of Classification Search
CPC combination set(s) only.
See application file for complete search history.

(56) References Cited

U.S. PATENT DOCUMENTS

| 7,941,053 | B2* | 5/2011 | Dallesasse | H04B 10/40 |
| | | | | 398/139 |
| 8,678,674 | B2* | 3/2014 | Kunii | H05K 3/30 |
| | | | | 385/92 |
| 10,534,147 | B2* | 1/2020 | Ozaki | G02B 6/4256 |
| 2003/0086660 | A1* | 5/2003 | Brezina | G02B 6/4201 |
| | | | | 385/88 |
| 2005/0175299 | A1* | 8/2005 | Hargis | G02B 6/4206 |
| | | | | 385/93 |
| 2005/0230795 | A1* | 10/2005 | Furuyama | G02B 6/428 |
| | | | | 257/678 |
| 2009/0148106 | A1* | 6/2009 | Moore | G02B 6/4281 |
| | | | | 385/89 |
| 2009/0239420 | A1* | 9/2009 | Nishio | H01R 13/658 |
| | | | | 439/656 |
| 2009/0324238 | A1* | 12/2009 | Kunii | H05K 1/189 |
| | | | | 398/135 |

(Continued)

FOREIGN PATENT DOCUMENTS

| JP | 2015-001563 A | 1/2015 |
| JP | 2019-191281 A | 10/2019 |

*Primary Examiner* — Agustin Bello
(74) *Attorney, Agent, or Firm* — Staas & Halsey LLP

(57) ABSTRACT

An optical module includes: a board that is accommodated in a housing and in which a through hole is formed; a metal plate that is bonded to an area of the board including the through hole; a component that is mounted on one surface of the metal plate and is arranged inside the through hole; and a thermal-conductive member that is arranged on another surface of the metal plate and transmits heat generated by the component to the housing.

9 Claims, 7 Drawing Sheets

(56) References Cited

U.S. PATENT DOCUMENTS

| | | | |
|---|---|---|---|
| 2012/0220152 A1* | 8/2012 | Wu | H01R 13/6581 |
| | | | 439/350 |
| 2013/0156418 A1* | 6/2013 | Stapleton | G02B 6/4283 |
| | | | 398/25 |
| 2017/0133777 A1* | 5/2017 | Little | H01R 13/6275 |
| 2018/0034211 A1* | 2/2018 | Little | H01R 13/642 |
| 2018/0368283 A1* | 12/2018 | Little | H05K 7/20336 |
| 2019/0181593 A1* | 6/2019 | Little | H01R 13/6587 |
| 2019/0278037 A1* | 9/2019 | Leigh | E05C 3/14 |
| 2019/0306985 A1* | 10/2019 | Ferguson | H05K 1/181 |
| 2021/0278614 A1* | 9/2021 | Kubo | H05K 1/0203 |

* cited by examiner

OPTICAL MODULE

CROSS-REFERENCE TO RELATED APPLICATION

This application is based upon and claims the benefit of priority of the prior Japanese Patent Application No. 2020-036724, filed on Mar. 4, 2020, the entire contents of which are incorporated herein by reference.

FIELD

The embodiment discussed herein is related to an optical module.

BACKGROUND

In recent years, an increasing number of pluggable optical modules that can be plugged into and unplugged from rack-type optical transmission equipment have been developed. Such an optical module may include a transmitter called a transmitter optical sub-assembly (TOSA) and a receiver called a receiver optical sub-assembly (ROSA). The TOSA and the ROSA may be formed by integrating optical devices such as an optical modulator and a photo diode (PD) into a box-type metal package. However, due to recent requirements for downsizing of equipment and speedup of communication, for example, there are an increasing number of cases in which the TOSA and the ROSA are formed by mounting the optical devices directly on a board.

When the optical nodule is inserted into a port of optical transmission equipment and connected, heat generated by heat-generating components such as an optical modulator and a digital signal processor (DSP) is dissipated through a heatsink provided to the optical transmission equipment.

Patent Document 1: Japanese Laid-open Patent Publication No. 2015-001563
Patent Document 2: Japanese Laid-open Patent Publication No. 2019-191281

However, the conventional optical module has problems that it is difficult to allocate an adequate transfer path for heat to the heatsink and the heat-dissipating efficiency thereof is poor. Specifically, in a case of the TOSA and the ROSA in the box-type metal package, heat can be dissipated from the metal package by filling, for example, thermal-conductive gel between the metal package and the heatsink. However, because flexibility of the position of mounting the metal package on the board is low, the positional relation between the metal package and the heatsink is not necessarily appropriate. Thus, depending on the position of mounting the metal package, the heat transfer path connecting between the metal package and the heatsink is not formed even when, for example, the thermal-conductive gel is used, and the heat-dissipating efficiency accordingly decreases.

In a case in which the metal package is mounted on the board, because the area for mounting another electronic component such as a DSP is reduced, a sub-board other than the main board may be provided in an electronic module. In this case, an area between various electronic components on the main board and the heatsink is blocked by the sub-board, which makes it difficult to form a heat transfer path from the electronic components on the main board to the heatsink. In this manner, when optical devices are integrated into the metal package to form the TOSA and the ROSA, it is difficult to keep the heat-dissipating efficiency of the optical module high.

In a case in which the TOSA and the ROSA are formed by mounting the optical devices directly on the board, optical components such as a lens and a ferrule and an optical waveguide that are mounted on the board are exposed without being protected by the metal package, for example. Because high positional precision is needed for the optical components and robustness of the optical waveguide against stress is low, it is not practical to fill, for example, the thermal-conductive gel between the electronic components on the board and the heatsink. Thus, heat generated by the electronic components on the board is transmitted to the board the thermal conductivity of which is not so high, and is not dissipated quickly.

SUMMARY

According to an aspect of an embodiment, an optical module includes: a board that is accommodated in a housing and in which a through hole is formed; a metal plate that is bonded to an area of the board including the through hole; a component that is mounted on one surface of the metal plate and is arranged inside the through hole; and a thermal-conductive member that is arranged on another surface of the metal plate and transmits heat generated by the component to the housing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiments of the present invention will be explained with reference to accompanying drawings. Note that the present invention is not limited to this embodiment.

Figure 1:
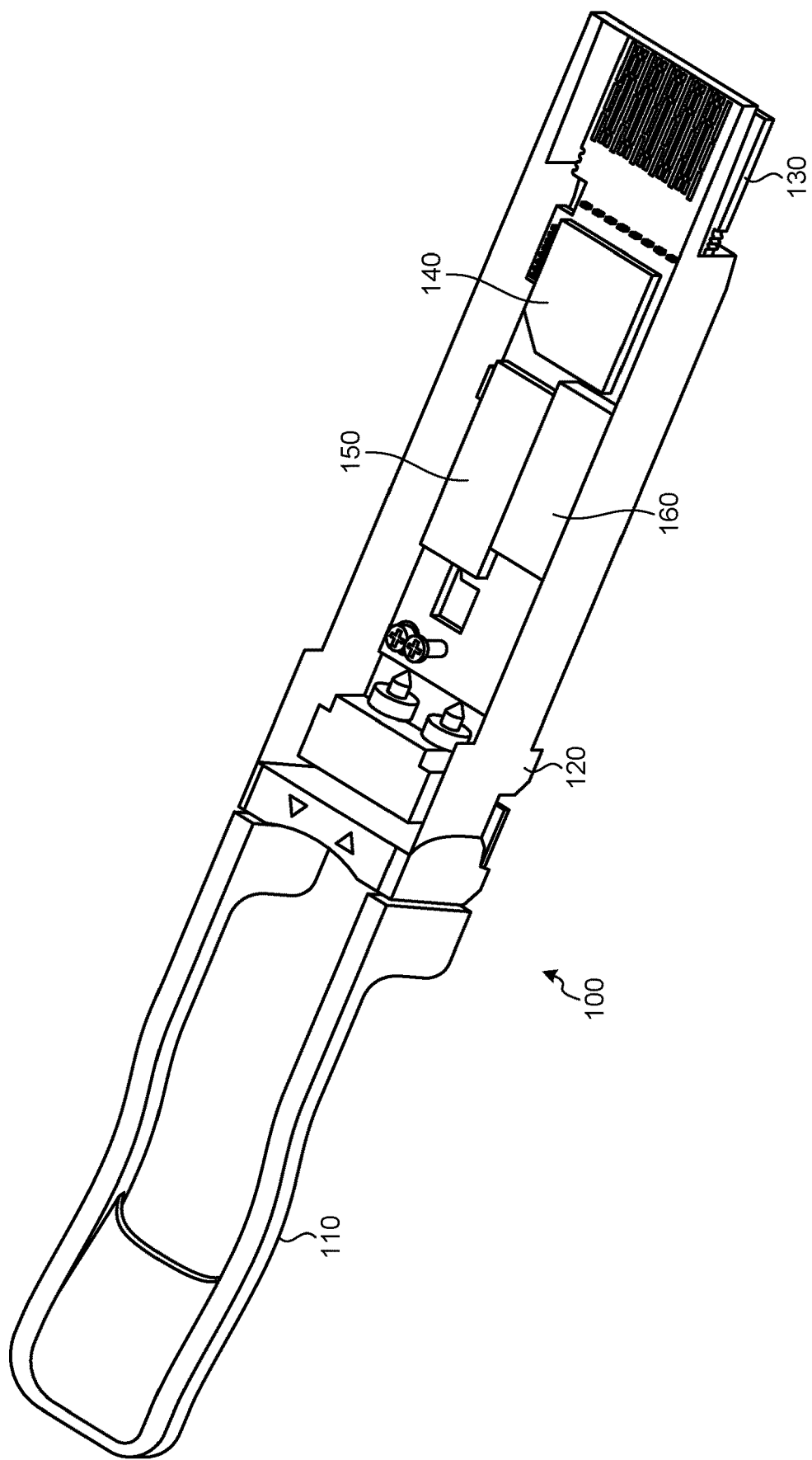
FIG. 1 is a diagram illustrating a configuration of an optical module according to one embodiment.

FIG. 1 is a perspective view illustrating a configuration of an optical module 100 according to the embodiment. In FIG. 1, a housing of the optical module 100 is partially cut off so that the inner configuration thereof can be viewed. The optical module 100 illustrated in FIG. 1 includes a pull-tab 110 and a housing 120. A board 130 is accommodated in the housing 120, and a DSP 140, a TOSA 150, and a ROSA 160 are mounted on the board 130.

The pull-tab 110 is a held portion that is held by a user when the optical nodule 100 is plugged into and unplugged from rack-type optical transmission equipment. To one end of the pull-tab 110 in its longitudinal direction, the housing 120 into which the board 130 is built is connected.

The housing 120 is a metallic case into which the board 130 and various components on the board are built. In FIG. 1, one surface of the housing 120 is cut off so that the board 130, the DSP 140, the TOSA 150, and the ROSA 160 can be viewed. To one end of the housing 120 in its longitudinal direction, the pull-tab 110 is connected. When being inserted into the rack-type optical transmission equipment, the optical module 100 is inserted into a port thereof from an end portion of the housing 120 opposite to the pull-tab 110. In this end portion, a terminal portion of the board 130 at its distal end is exposed from the housing 120.

The board 130 is a circuit board that is accommodated in the housing 120 and on which electronic components and optical components of various types are mounted. As will be described later, a through hole is formed in the board 130, and part of the TOSA 150 is arranged inside the through hole. The distal end of the board 130 is exposed from the housing 120, and serves as a terminal that is electrically connected to the rack-type optical transmission equipment when the optical module 100 is inserted into the optical transmission equipment. Herein, the board 130 may be a multilayer board having wiring not only in an outer layer but also in an inner layer.

The DSP 140 is one of the electronic components to be mounted on the board 130. The DSP 140 generates a transmission signal that is converted into an optical signal by the TOSA 150, and modulates a received signal that has been converted into an electric signal by the ROSA 160. The DSP 140 is an electronic component that performs signal processing at high speed, and thus is a heat-generating component that generates a relatively large amount of heat.

The TOSA 150 includes a light source, an optical modulator, and an optical component, optically modulates light emitted by the light source with the optical modulator, and sends the resulting optical transmission signal to an optical fiber via the optical component. The TOSA 150 includes the optical modulator the processing load of which is heavy, and thus is a heat-generating component that generates a relatively large amount of heat. Thus, on a metal plate that forms a bottom portion of the TOSA 150, a heat-dissipating sheet is stuck. Furthermore, between the heat-dissipating sheet, and a heatsink of the optical transmission equipment, a thermal-conductive member such as a thermal-conductive gel is arranged. The specific configuration of the TOSA 150 will be described later in detail.

The ROSA 160 includes a PD that performs photoelectric conversion, and converts an optical received signal input from the optical fiber into an electric received signal. The ROSA 160 then outputs the electric received signal to the DSP 140. Because the processing load of the PD included in the ROSA 160 is relatively light, the amount of heat generated by the ROSA 160 is smaller than the amount of heat generated by the TOSA 150.

Figure 2:
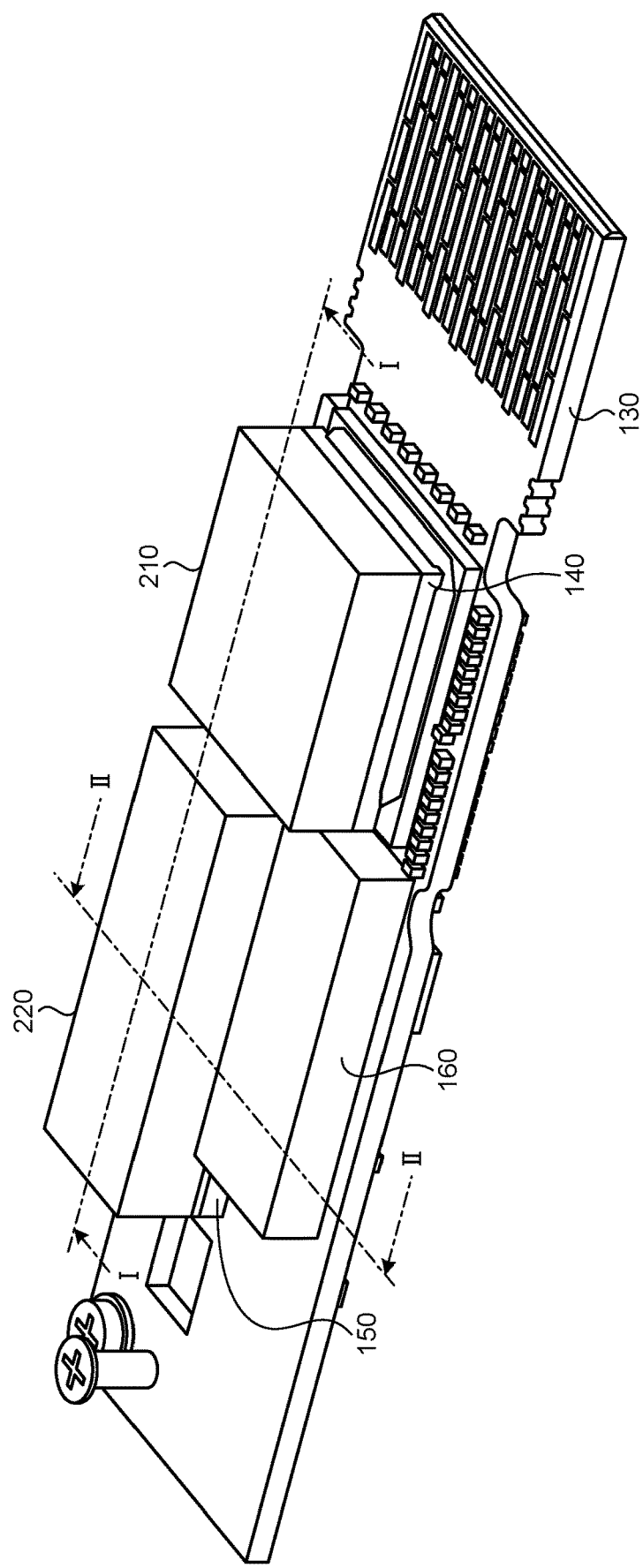
FIG. 2 is a diagram illustrating a configuration of main parts of the optical module according to the embodiment.

FIG. 2 is a perspective view illustrating a configuration of main parts of the optical module 100. In FIG. 2, components mounted on one surface of the board 130 are illustrated.

As illustrated in FIG. 2, a thermal-conductive member 210 such as a thermal-conductive gel is arranged on the upper surface of the DSP 140, and a thermal-conductive member 220 such as a thermal-conductive gel is arranged also on the upper surface of the TOSA 150. In the description herein, a direction extending from the board 130 toward the DSP 140 is defined as an upward direction, and the thermal-conductive members 210 and 220 are respectively "arranged on the upper surfaces" of the DSP 140 and the TOSA 150. However, the optical module 100 does not necessarily have to be used in an attitude in which the direction extending from the board 130 toward the DSP 140 is the upward direction. In other words, the optical module 100 may be used in any attitude, and may be used, for example, in an attitude in which the direction extending from the board 130 toward the DSP 140 is a downward direction.

The thermal-conductive members 210 and 220 are respectively arranged on the upper surfaces of the DSP 140 and the TOSA 150, which are heat-generating components that generate a relatively large amount of heat. Specifically, the thermal-conductive members 210, 220 are arranged such that the upper surfaces of the heat-generating components are connected to the metallic housing 120 to be brought into contact, with the heatsink of the optical transmission equipment. By this arrangement, the thermal-conductive members 210, 220 serve as transfer paths for heat generated by the heat-generating components, and the heat generated by the heat-generating components is transmitted through the thermal-conductive members 210, 220 and the housing 120 to the heatsink and dissipated. Herein, the thermal-conductive members 210, 220 each may be a thermal-conductive filler made of material such as silicone containing a filler the thermal conductivity of which is high, or may be metal that is similar to the metal plate forming the bottom portion of the TOSA 150.

The TOSA 150 is formed by mounting the optical component and the optical modulator on the metal plate. Herein, the optical component and the optical modulator mounted on the metal plate are arranged inside the through hole formed in the board 130. Specifically, the thermal-conductive member 220 is arranged on the upper surface of the metal plate, the optical component and the optical modulator are mounted on the lower surface of the metal plate, and the optical component and the optical modulator are arranged inside the through hole of the board 130. In other words, in FIG. 2, the lower surface of the metal plate is a component mounted surface.

Figure 3:
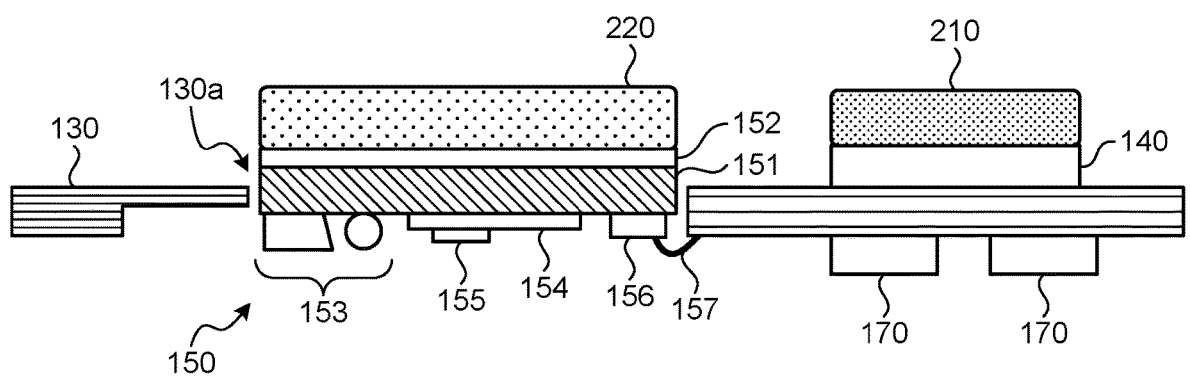
FIG. 3 is a schematic diagram illustrating a cross-section taken along line I-I in FIG. 2.

FIG. 3 is a schematic diagram illustrating a cross-section taken along line I-I in FIG. 2. As illustrated in FIG. 3, in the board 130, a through hole 130a is formed. The DSP 140 is mounted on the upper surface of the board 130, and the thermal-conductive member 210 is arranged on the upper surface of the DSP 140. On the lower surface of the board 130, electronic components 170 that operate at relatively low speed and generate a small amount of heat are mounted. Specifically, the DSP 140 that is a heat-generating component is arranged on an upper surface of the board 130 that is a side closer to the heatsink of the optical transmission equipment, whereby the DSP 140 and the metallic housing 120 that is brought into contact with the heatsink are connected by the thermal-conductive member 210. By this arrangement, heat generated by the DSP 140 is transmitted through the thermal-conductive member 210, and is dissipated from the housing 120 and the heatsink. In other words, the heat-dissipating efficiency for heat generated by the DSP 140 can be improved.

The TOSA 150 includes a metal plate 151 at its bottom portion, and on a lower surface thereof that is a component mounted surface of the metal plate 151, optical components 153 such as a lens and a ferrule, an optical modulator 154, light sources 155 such as laser diodes (LD), and a driver 156 are mounted. In response to a transmission signal supplied from the driver 156, the optical modulator 254 modulates light emitted by each light source 155, and the optical components 153 send the resulting optical transmission signal to an optical fiber. Because the optical components 153, the optical modulator 154, and the light sources 155 are mounted on the metal plate 151, the positional relation of these components can be maintained with high precision, whereby optical connection loss can be reduced. As the metal plate 151, a copper alloy such as copper tungsten or copper molybdenum having high thermal conductivity, for example, can be used.

The optical components 153, the optical modulator 154, the light sources 155, and the driver 156 mounted on the component mounted surface of the metal plate 151 are arranged inside the through hole 130*a* formed in the board 130. The height of the lower surface of the driver 156 and the height of the lower surface of the board 130 are set substantially the same by adjusting the thickness of the metal plate 151, and the driver 156 is connected to the board 130 by wire bonding with a wire 157. Thus, the length of the wire 157 connecting between the driver 156 and the board 130 can be set as short as 100 to 300 micrometers, for example, whereby deterioration of transmission characteristics of electric signals between the TOSA 150 and the board 130 can be reduced.

On a surface of the metal plate 151 opposite to the component mounted surface thereof, a heat-dissipating sheet 152 is stuck, and the thermal-conductive member 220 is arranged on the upper surface of the heat-dissipating sheet 152. The upper surface of the thermal-conductive member 220 is in contact with the metallic housing 120 in the same manner as the upper surface of the thermal-conductive member 210, and heat generated by the optical modulator 154 and the driver 156 is transmitted to the metal plate 151, the heat-dissipating sheet 152, and the thermal-conductive member 220, and is dissipated from the housing 120 and the heatsink. In ether words, the heat-dissipating efficiency for heat generated by the TOSA 150 can be improved.

Figure 4:
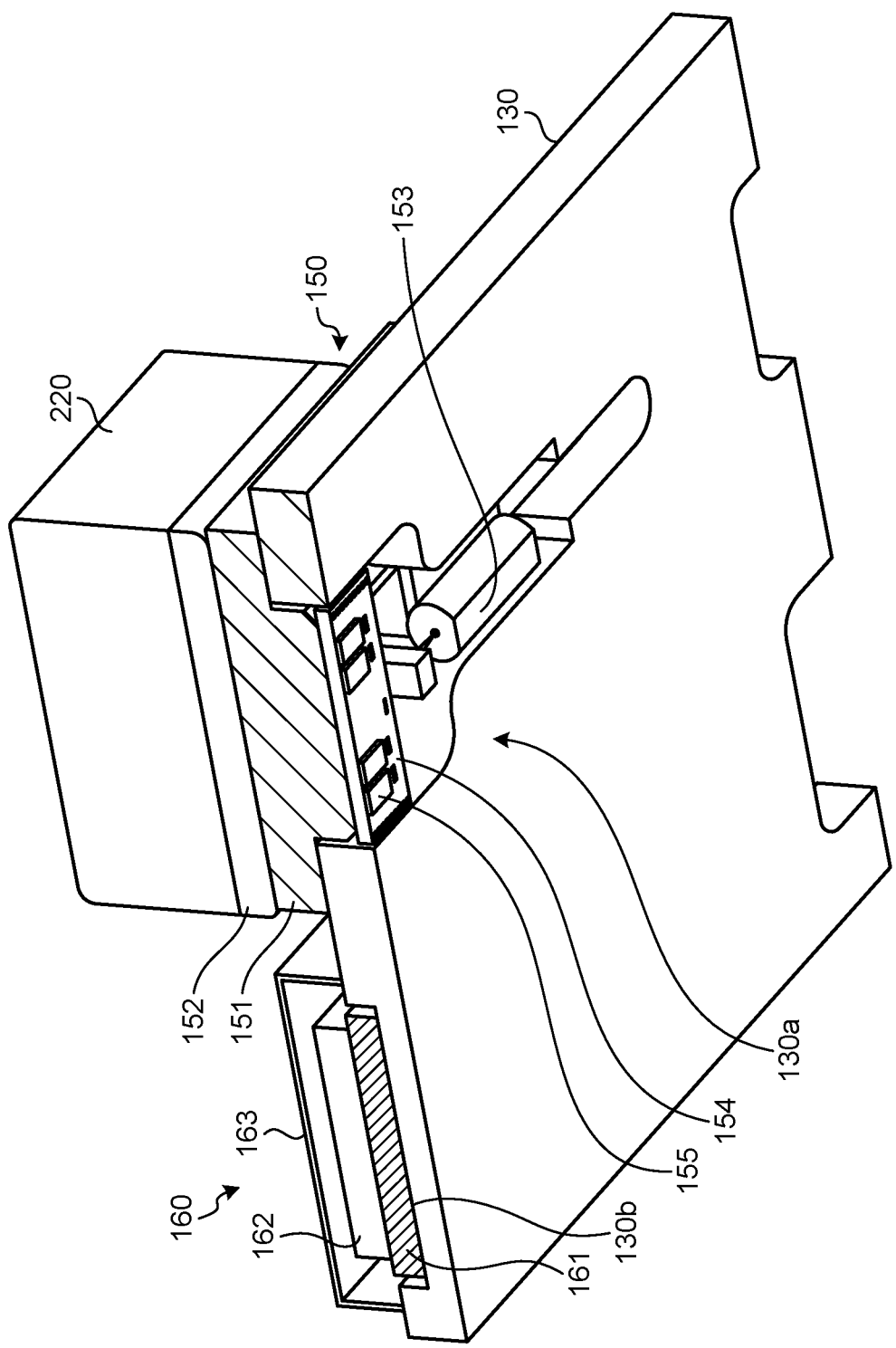
FIG. 4 is a schematic diagram illustrating a cross-section taken along line II-II in FIG. 2.

FIG. 4 is a schematic diagram illustrating a cross-section taken along line II-II in FIG. 2. As illustrated in FIG. 4, the metal plate 151 forming the bottom portion of the TOSA 150 is bonded to an area including the through hole 130*a* of the board 130, and the optical components 153, the optical modulator 154, and the light sources 155 mounted on the lower surface of the metal plate 151 are arranged inside the through hole 130*a*. A metal plate 161 forming the bottom portion of the ROSA 160 is bonded to a recessed portion 130*b* formed in the board 130, and an optical component 162 such as a PD is mounted on the upper surface of the metal plate 161. The metal plate 161 and the optical component 162 are covered by a lid member 163 to be protected. As described above, while the lower surface of the metal plate 151 is used as a component mounted surface in the TOSA 150, the upper surface of the metal plate 161 is used as a component mounted surface in the ROSA 160, whereby the distance between wires of the TOSA 150 and the ROSA 160 is increased. Consequently, crosstalk between the TOSA 150 and the ROSA 160 can be reduced.

Herein, although the ROSA 160 does not necessarily have to be arranged in the recessed portion 130*b* of the board 130, surfaces of the optical component 162 and the board 130 can be set flush with each other by arranging the ROSA 160 in the recessed portion 130*b* and adjusting the thickness of the metal plate 161. Consequently, the length of a wire connecting between the optical component 162 and the board 130 can be set shorter, whereby deterioration of transmission characteristics of electric signals between the ROSA 160 and the board 130 can be reduced.

The following describes a method for manufacturing the optical module 100 according to the embodiment.

Figure 5:
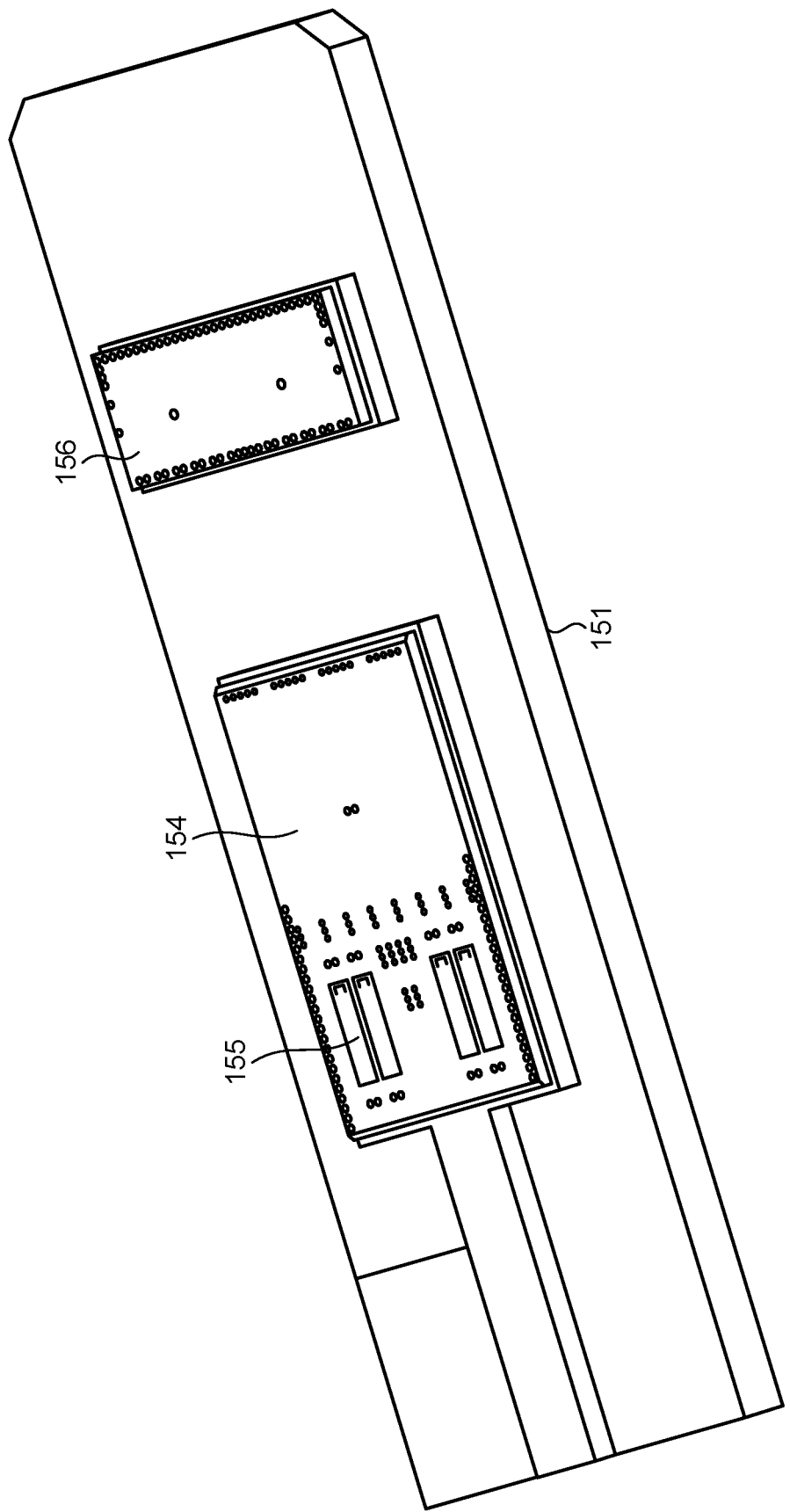
FIG. 5 is a diagram illustrating a step of constructing a transmitter.

To begin with, the TOSA 150 as a transmitter and the ROSA 160 as a receiver are each constructed. In other words, on the metal plates 151 and 161 forming the bottom portions of the TOSA 150 and the ROSA 160, the respective components are mounted. Specifically, as illustrated in FIG. 5, for example, on the metal plate 151 forming the bottom portion of the TOSA 150, the optical modulator 154, the light sources 155, and the driver 156 are mounted. At this time, the optical components 153 that need highly accurate positioning are not mounted, the driver 156 and the optical modulator 154 integrated with the light sources 155 are bonded to the metal plate 151 with an electrically conductive adhesive such as a silver-epoxy adhesive.

When the TOSA 150 and the ROSA 160 have been constructed, the TOSA 150 and the ROSA 160 are mounted on the board 130. Specifically, the TOSA 150 is mounted thereon by bonding the metal plate 151 to the board 130 with the optical modulator 154 and the driver 156 being inserted into the through hole 130*a* of the board 130. The ROSA 160 is mounted thereon by bonding the metal plate 161 to a bottom surface of the recessed portion 130*b* of the board 130. Furthermore, on the board 130, the DSP 140 and the other electronic components 170 are mounted by surface-mount technology (SMT) or a ball grid array (BGA), for example.

Figure 6:
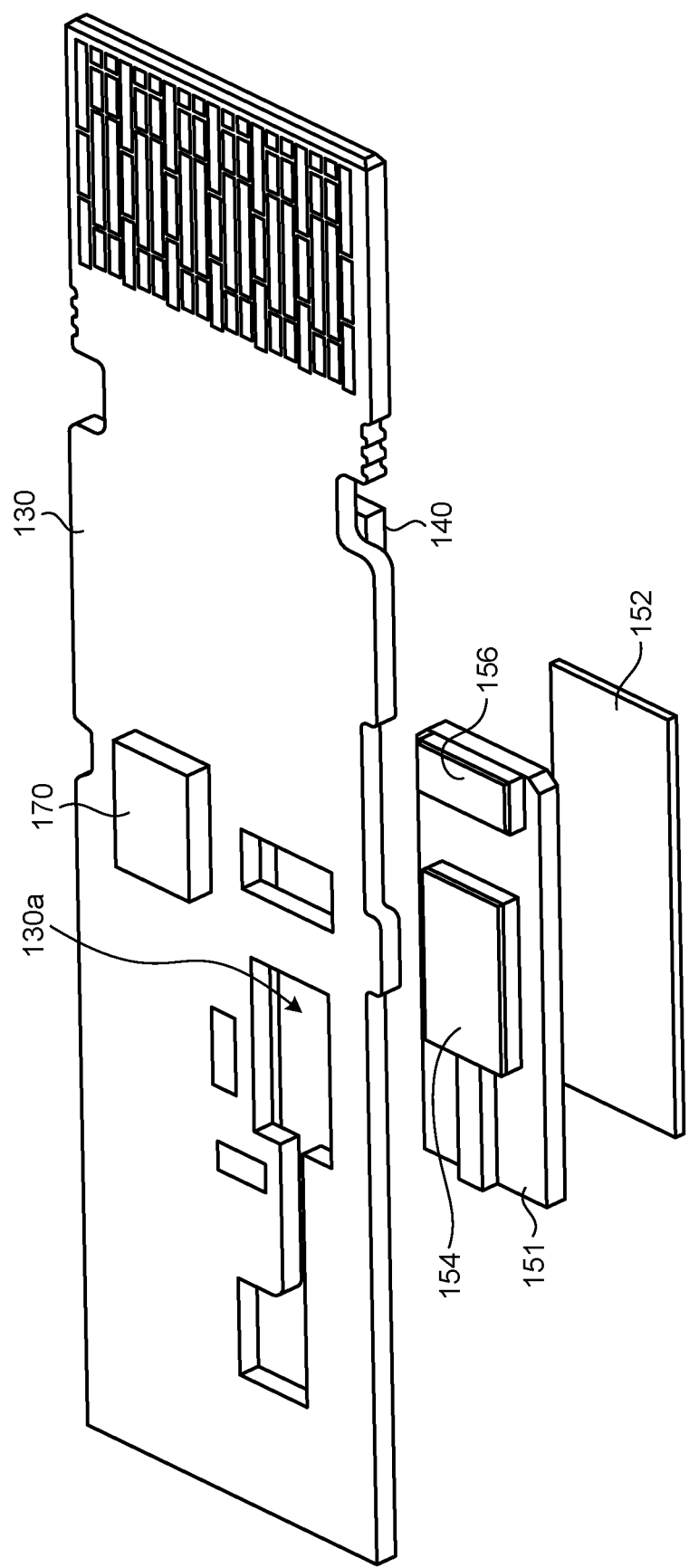
FIG. 6 is a diagram illustrating a step of fitting the transmitter.

Specifically, as illustrated in FIG. 6, for example, protruding portions of the metal plate 151 are fitted into the through hole 130*a* of the board 130 such that the optical modulator 154 and the driver 156 are arranged inside the through hole 130*a*, and the metal plate 151 is bonded to the board 130. On a surface of the metal plate 151 opposite to the board 130, the heat-dissipating sheet 152 is stuck. On a surface of the board 130 to which the metal plate 151 is bonded, the ROSA 160 is mounted, and also a heat-generating component such as the DSP 140 is mounted. On a surface of the board 130 opposite to the surface thereof to which the metal plate 151 is bonded, the electronic components 170 that generate a small amount of heat is mounted.

Figure 7:
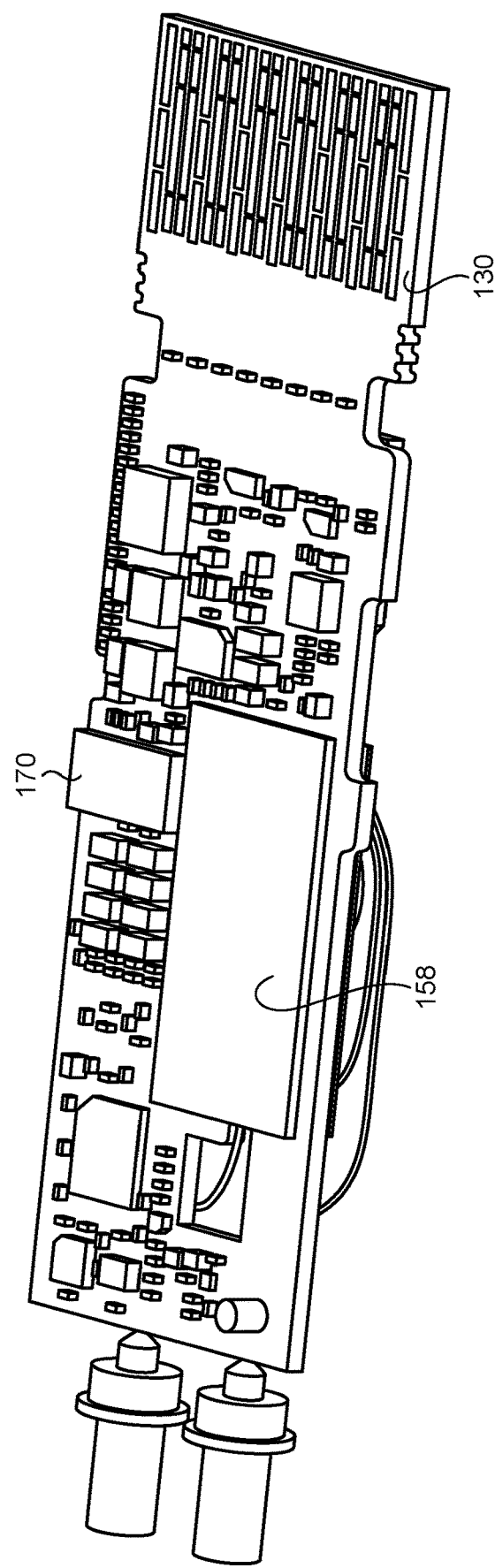
FIG. 7 is a diagram illustrating a specific example of mounting the transmitter.

As described above, on one surface of the board 130, heat-generating components such as the metal plate 151 of the TOSA 150 and the DSP 140 are mounted in a collective manner, and on the other surface of the board 130, the electronic components 170 that generate a small amount of heat are mounted in a collective manner. By this configuration, heat can be efficiently dissipated from the one surface of the board 130. Herein, while the optical modulator 154 and the driver 156 of the TOSA 150 are arranged inside the through hole 130*a* of the board 130, an area including the through hole 130*a* of the board 130 may be covered with a lid member 158 as illustrated in FIG. 7, for example, in order to protect these components.

When the DSP 140, the TOSA 150, the ROSA 160, and the other electronic components 170 have been mounted on the board 130, the optical components 153 such as a ferrule and a lens connected to an optical fiber are bonded to the metal plate 151. Specifically, while being positioned with high precision, the optical components 153 are bonded to the metal plate 151 with adhesive such as photo-curable resin.

On the surfaces of the DSP 140 and the heat-dissipating sheet 152 that are exposed, the thermal-conductive members 210 and 220 are respectively arranged, and the board 130 on which the respective components are mounted is accommodated in the housing 120. At this time, the thermal-conductive members 210, 220 are in contact with one surface of the housing 120. Thus, the optical module 100 is completed.

As described in the foregoing, according to the present embodiment, the TOSA is mounted such that components to be mounted on the metal plate thereof are arranged inside the through hole of the board, and the thermal-conductive member is arranged between a surface of the metal plate opposite to the component mounted surface and the housing. By this arrangement, heat generated by the optical modulator and the driver of the TOSA is transmitted through the metal, plate and the thermal-conductive member to the housing and dissipated. Thus, the heat-dissipating efficiency of the optical module can be improved. Furthermore, a surface of the optical modulator or the driver and a surface of the board can be set flush with each other, whereby the length of a wire connecting between the optical modulator or the driver and the board can be set shorter. Consequently, deterioration of transmission characteristics of electric signals can be reduced.

In the above-described embodiment, the TOSA 150 is constructed by mounting the optical modulator 154 and the driver 156 on the metal plate 151. However, the driver 156 may be mounted on the board 130 instead of the metal plate 151. In this case, the height of the surface of the optical modulator 154 and the height of the surface of the board 130 only need to be set substantially the same by adjusting the thickness of the metal plate 151, whereby the length of the wire connecting between the optical modulator 154 and the surface of the board 130 may be set shorter. Furthermore, the height of the surface of the driver 156 and the height of the surface of the board 130 may be set substantially the same by mounting the driver 156 onto a recessed portion formed in the board 130, whereby the length of the wire connecting between the surface of the driver 156 and the surface of the board 130 may be set shorter.

In the above-described embodiment, the optical modulator 154 integrated with the light sources 155 is used. However, the light sources 155 do not necessarily have to be integrated with the optical modulator 154. Specifically, on the metal plate 151, the light sources 155 that are separate therefrom may be mounted, and the optical modulator 154 may modulate light emitted by each light source 155.

According to the aspect of the optical module disclosed by the present invention, an effect of improving the heat-dissipating efficiency can be obtained.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various Changes, substitutions, and alterations could be made hereto without departing from the spirit and scope of the invention.

What is claimed is:
1. An optical module comprising:
   a board that is accommodated in a housing and in which a through hole is formed;
   a metal plate that is bonded to an area of the board including the through hole;
   a component that is mounted on one surface of the metal plate and is arranged inside the through hole such that a surface of the component and a surface of the board are set flush with each other; and
   a thermal-conductive member that is arranged on another surface of the metal plate and transmits heat generated by the component to the housing.
2. The optical module according to claim 1, wherein the component includes:
   an optical modulator that modulates light emitted by a light source; and
   an optical component that sends, to an optical fiber, an optical signal obtained by modulation by the optical modulator.
3. The optical module according to claim 2, wherein the optical modulator is arranged inside the through hole such that a height of a surface of the optical modulator is substantially same as a height of a surface of the board, and the surface of the optical modulator is connected to the surface of the board by a wire.
4. The optical module according to claim 2, wherein the component further includes a driver that supplies a transmission signal to the optical modulator.
5. The optical module according to claim 4, wherein the driver is arranged inside the through hole such that a height of a surface of the driver is substantially same as a height of a surface of the board, and the surface of the driver is connected to the surface of the board by a wire.
6. The optical module according to claim 1, further comprising an optical component that converts an input optical signal into an electrical signal, wherein
   the board has a recessed portion that is formed in a surface of the board to which the metal plate is bonded, and
   the optical component is arranged in the recessed portion.
7. The optical module according to claim 6, wherein the optical component is arranged in the recessed portion such that a height of a surface of the optical component is substantially same as a height of the surface of the board, and the surface of the optical component is connected to the surface of the board by a wire.
8. The optical module according to claim 1, further comprising a heat-generating component that is arranged on a surface of the board to which the metal plate is bonded, and generates heat.
9. The optical module according to claim 8, further comprising an electronic component that is arranged on a surface of the board opposite to the surface to which the metal plate is bonded, and generates a smaller amount of heat than the heat-generating component does.

* * * * *